United States Patent [19]

Kozaki et al.

[11] Patent Number: 4,838,377
[45] Date of Patent: Jun. 13, 1989

[54] CAR ELECTRONIC DEVICE HAVING ANTITHEFT MECHANISM

[75] Inventors: Kengo Kozaki; Toshiyuki Nakazaki, both of Tokyo, Japan

[73] Assignee: Clarion, Co., Ltd., Tokyo, Japan

[21] Appl. No.: 160,517

[22] Filed: Feb. 26, 1988

[30] Foreign Application Priority Data

Mar. 2, 1987 [JP] Japan ............................ 62-030237[U]
Mar. 2, 1987 [JP] Japan ............................ 62-030238[U]
Mar. 12, 1987 [JP] Japan ............................ 62-036413[U]

[51] Int. Cl.⁴ ............................................ B60R 25/00
[52] U.S. Cl. .................................. 180/287; 340/426; 307/10.2
[58] Field of Search .......................... 180/287; 340/63

[56] References Cited

U.S. PATENT DOCUMENTS 3,718,202 2/1973 Brock .................................. 180/287
3,790,933 2/1974 Cort .................................... 180/287
4,553,511 11/1985 Hayakawa et al. ................. 180/287

Primary Examiner—Kenneth R. Rice
Attorney, Agent, or Firm—Flynn, Thiel, Boutell & Tanis

[57] ABSTRACT

An antitheft mechanism for an electronic device to be used in a car has three modes of operation. A normal operation mode permits continuous operation of the device. A line mode permits normal operation for a limited time after which it is replaced by a theft mode. The theft mode inhibits normal operation of the device until a secret code is entered into the device to return it to the normal mode or until a specified common operation of the device returns it to the line mode.

10 Claims, 6 Drawing Sheets

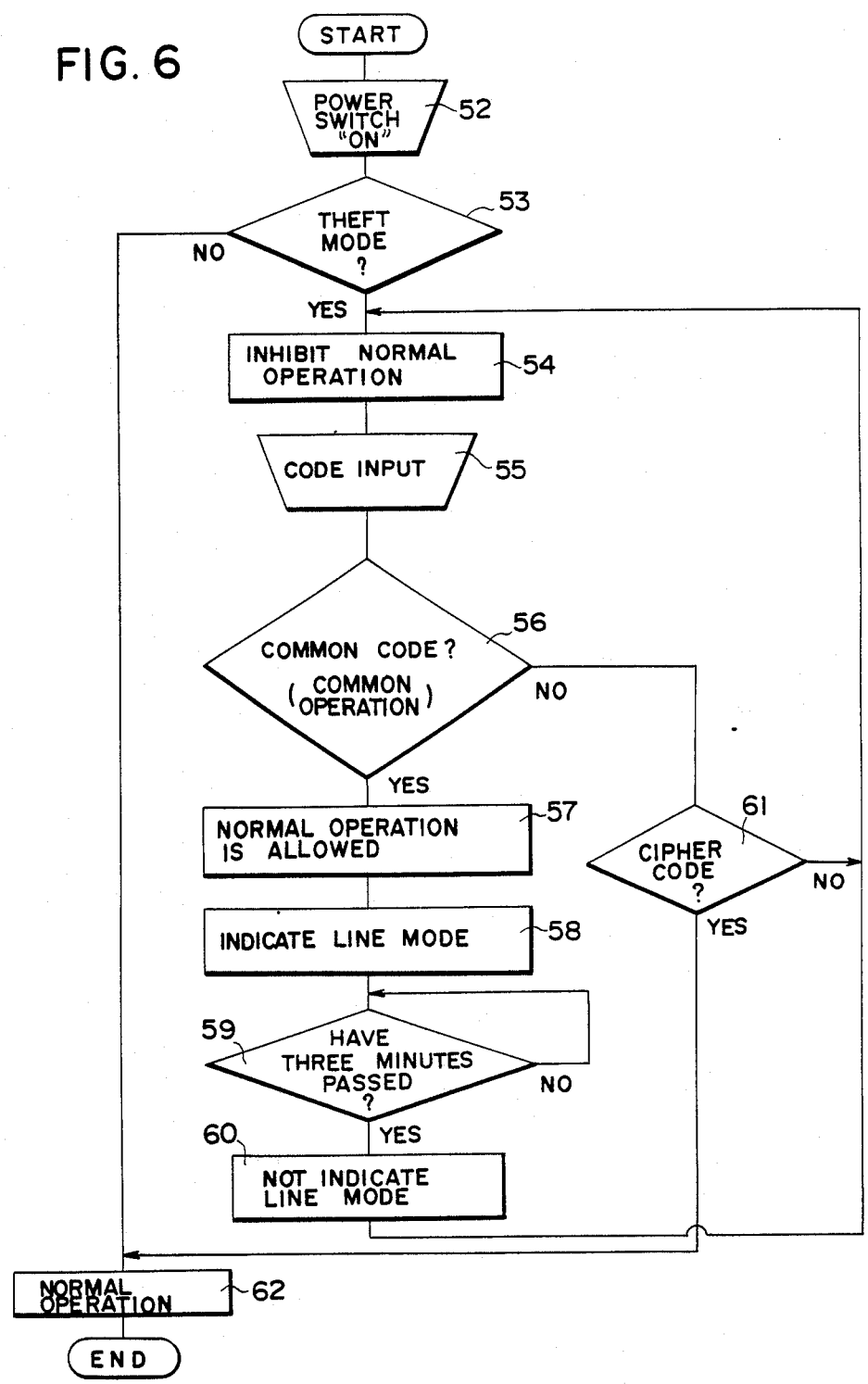

CAR ELECTRONIC DEVICE HAVING ANTITHEFT MECHANISM

FIELD OF THE INVENTION

This invention relates to a car electronic device such as radio, audio device and wireless communication system having an antitheft mechanism capable of effectively protecting the car electronic device against robbery.

BACKGROUND OF THE INVENTION

The Applicant already proposed a computer antitheft system (named "CATS" by the Applicant) as an antitheft mechanism of a car electronic device. The device may take a theft mode in which the device is inoperative so as to indirectly protect the device against robbery.

The theft mode is cancelled when a specific secret code normally consisting of four to six digits and inputted by an operator coincide with a secret code specifically assigned to the device. In this connection, such an antitheft mechanism in general includes a release means comprising a memory means for storing a particular code and a detector means for detecting coincidence between an inputted code and the particular code.

This arrangement, however, invites an inconvenience in the process of manufacturing the device itself or of mounting the finished device in a car. That is, every time when the device is tested or removed from the car for repair, a secret code unique to the device must be entered to cancel the theft mode and to establish its normal operative mode in order to reactivate the device.

This means that an operator in the manufacturing, mounting or testing process must know and confirm unique codes of individual devices, which causes a slow-down of the operation. Beside this, the unique code which should be maintained unknown becomes apparent to a third party, and this drops the value of the antitheft mechanism itself.

SUMMARY OF THE INVENTION

In order to solve the drawbacks involved in the prior art car electronic devices, the invention provides a car electronic device having an antitheft mechanism which can take a normal operative mode capable of continuously effecting a normal operation, a theft mode incapable of effecting the normal operation and a line mode capable of effecting the normal operation for a limited time and subsequently replaced by said theft mode, said theft mode being replaced by said normal operative mode when a secret code unique to said device is inputted but replaced by said line mode when a common operation common to all such devices is effected.

BRIEF DESCRIPTION OF THE DRAWINGS

FIGS. 4 to 6 are flow charts showing the control process of the embodiment of FIG. 3.

DETAILED DESCRIPTION

Figure 1:
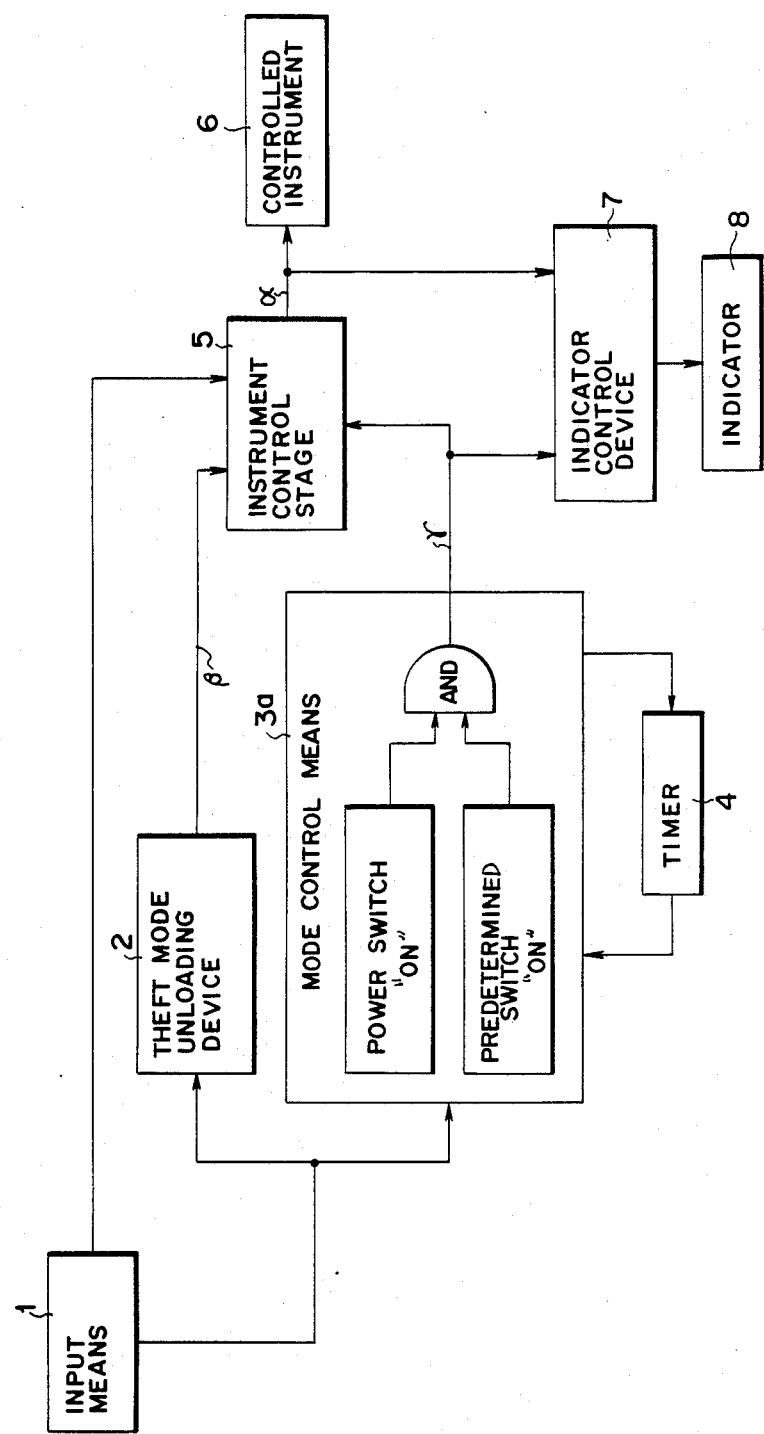
FIGS. 1 and 2 are block diagrams of an embodiment of the invention in which the system is controlled by a circuit.
Figure 2:
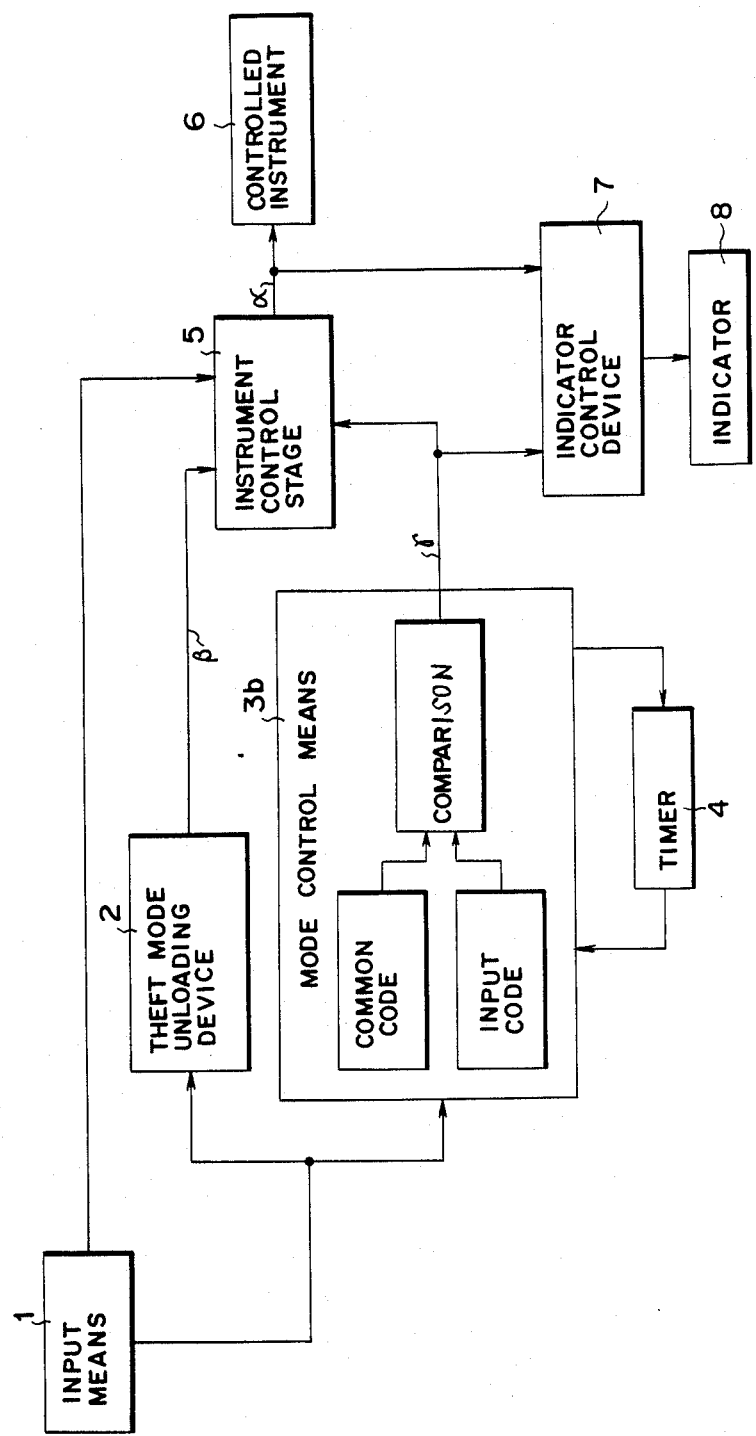

FIGS. 1 and 2 are block diagrams showing car electronic devices according to the invention. They are different in mode control means 3a and 3b alone and are completely identical in the remainder.

A device major assembly (hereinafter called "controlled instrument") 6 is an assembly operative as a car electronic device such as radio, cassette tape deck, wireless system and so forth. The controlled instrument 6 is supplied with and controlled by a theft mode signal α from an instrument control stage 5. The instrument control stage 5 detects, for example, an interruption of a backup power source as a sign of a robbery, and is subsequently responsive to a power-in signal from an input means 1 to supply the controlled instrument 6 with a theft mode signal α instructive of prohibition of a normal operation of the controlled instrument 6. The theft mode signal α may be determined adequately according to the kind of the controlled instrument 6. For example, a mute signal or the like is suitable for a radio, and a motor stop signal is effective in a cassette tape deck. The instrument control stage 5 is provided with a theft mode unloading device 2 which cancels the theft mode and establishes a normal operative mode in which the controlled instrument 6 is operative. The theft mode unloading device 2 may be selected among various arrangements. This embodiment employs an arrangement in which when a predetermined cipher or other secret code is inputted through the input means 1, the theft mode unloading device 2 compares the inputted code with an originally stored secret code and produces a theft mode unloading signal β to the instrument control stage 5 when both codes coincide with each other. The secret code is normally made of four to six digits.

The mode control means 3a/3b supplies the instrument control stage 5 with a normal operation signal γ not depending on the theft mode unloading device 2, i.e. not depending on an input of the secret code, so as to activate the controlled instrument 6 for its normal operation. As described above, the cancelling operation of the theft mode unloading device 2 of a controlled instrument is normally different from those of other controlled instruments. For example, when the system is configured to effect the cancelling operation by coincidence between codes, controlled instruments have different unique codes. However, it is possible and preferable to uniform the operation of the mode control means 3a/3b in all controlled instruments.

Various specific arrangements may be employed as that of the mode control means 3a/3b. For example, an arrangement shown at 3a in FIG. 1 may be employed in which simultaneous operation of a power switch and another predetermined switch are detected, a resulting detection signal being sent to the instrument control stage 5 to temporarily cancel the theft mode and activate the controlled instrument for its normal operation for a limited time. That is, the mode control means 3a may be configured to detect double operations in which a power switch is turned on while a switch of the input means 1, e.g. a BAND switch, etc. of a radio, is depressed. Further, as shown at 3b in FIG. 2, a code common to all controlled instruments may be originally determined so that the controlled instrument is activated for its normal operation when an inputted code coincides with the common code.

In either arrangement, the mode control means 3a/3b can temporarily cancel the theft mode without using the theft mode unloading device 2 and can activate the controlled instrument for its normal operation (transition to the line mode) for a limited time.

A line mode signal γ supplied from the mode control means 3a/3b is bifurcated and entered in an indicator control device 7 which produces a signal for activating an indicator 8 to indicate that the instrument is in the line mode. The theft mode signal α may be entered in the indicator control device 7 from the instrument control stage 5 so that the indicator 8 also displays that the instrument is in the theft mode.

Upon a predetermined common operation such as simultaneously operating the power and other switches or inputting a common code and upon generation of the line mode signal γ from the mode control means 3a/3b, the timer 4 is activated simultaneously. After a predetermined time, the mode control means 3a/3b is supplied with a signal, and the line mode signal γ is removed. Responsively, the instrument control stage 5 produces the theft mode signal α again to prohibit the normal operation of the controlled instrument 6. The time determined by the timer 4 is preferably long enough to perform a simple test or inspection but too short to use the instrument continuously. In most cases, one to five minutes is preferable unless a particular test requires otherwise. The temporary normal operation in the line mode is replaced by the theft mode soon after a predetermined time, it is not possible to make an illicit use thereof.

Figure 3:
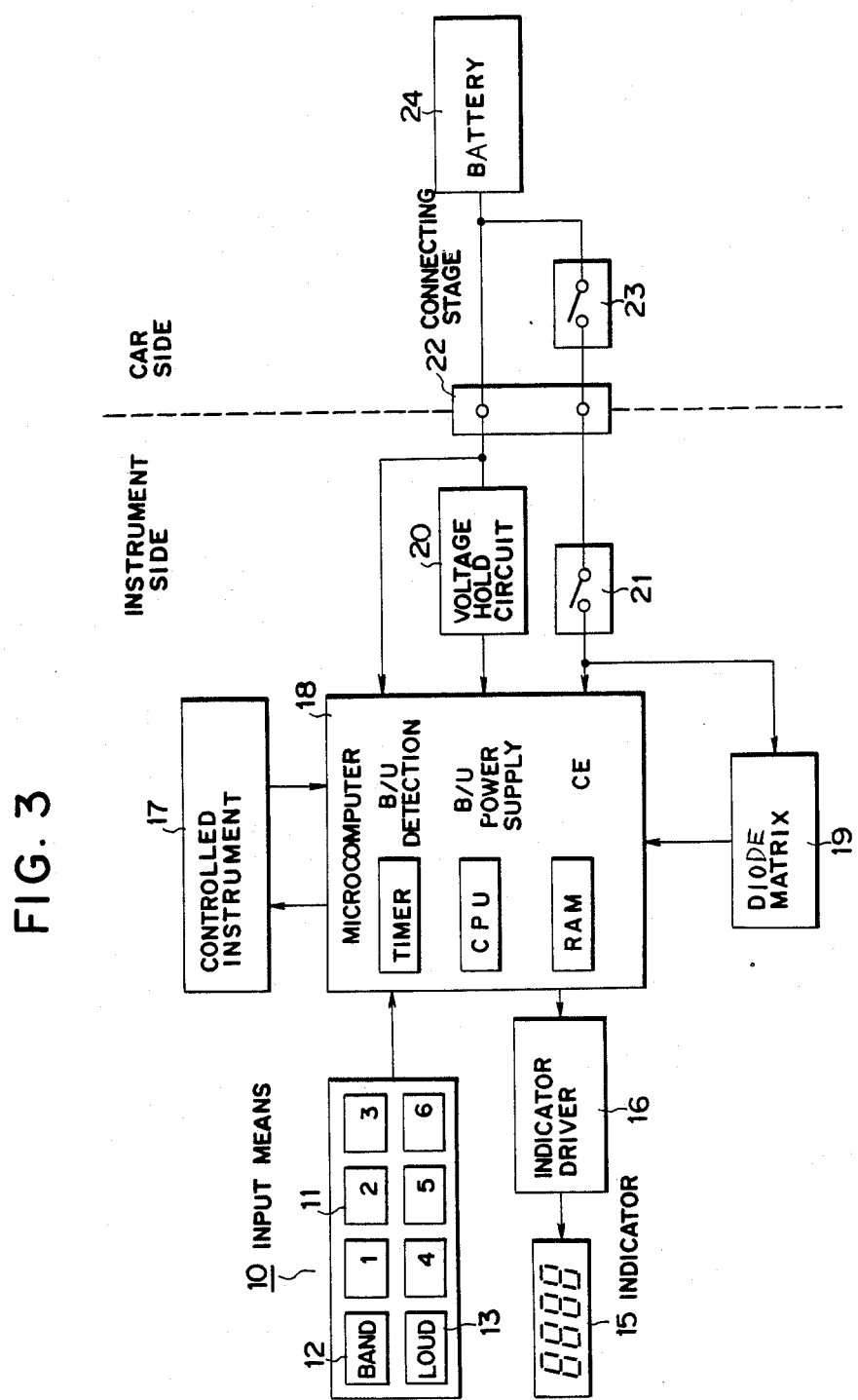
FIG. 3 is a block diagram showing a further embodiment of the invention in which the system is controlled by a software using a microcomputer.

FIG. 3 is a block diagram of a further embodiment of the invention used in a car radio and including a microcomputer. A controlled instrument 17 is operative as a radio and controlled by a microcomputer 18 having various functions as a timer, CPU, RAM, etc. Since the embodiment is directed to a radio, an input means 10 includes preset channel keys 11, band switching key 12, loudness key 13, etc. An indication signal from the microcomputer 18 is applied to an indicator driver 16 to indicate various information on an indicator 15. When the car radio is held in position in a car, a connecting stage 22 is connected to a car battery 24. Therefore, the power of the battery 24 is supplied to a backup (B/U) power source terminal of the microcomputer via a voltage hold circuit 20. A power switch 21 is used to turn on or off the entire instrument, and is located on a panel on which the input means 10 is provided.

When the instrument is removed from the car, the connecting stage 22 is detached from the battery 24. This is detected at the B/U detection terminal, and the instrument is set in the theft mode. In this configuration, the power supply from the car battery is completely interrupted. However, various information stored in the microcomputer 18 is maintained due to an operation of the voltage hold circuit 20. Since the instrument is set in the theft mode in this fashion, the operative mode of the controlled instrument 17 (radio) is not recovered by merely re-mounting it in a car and connecting the connecting stage 22 to the battery 24 and by turning on the ACC switch 23 and the power switch 21 so that the chip-enable (CE) of the microcomputer 18 exhibits HIGH. In order to cancel the theft mode and establish the normal operative mode or the line mode, a secret code specifically assigned to the instrument must be entered, or alternatively, a common operation determined commonly to all instruments must be performed. Some specific arrangements may be employed as the common operation. Among them, simultaneous operation of two switches appears to be most preferable. The embodiments employ combination of the band switching key 12 and the loudness key 13 or combination of the power switch 21 and the band switching key 12. In combination of the power switch 21 and the band switching key 12, more reliable and simple control is expected by arranging so that the power switch 21 is turned on while the band switching key 12 is depressed.

Contents of the secret code and the common operation are written and stored in a RAM of the microcomputer 18 via an originally adjusted diode matrix 19 when the power switch 21 is turned on.

Figure 4:
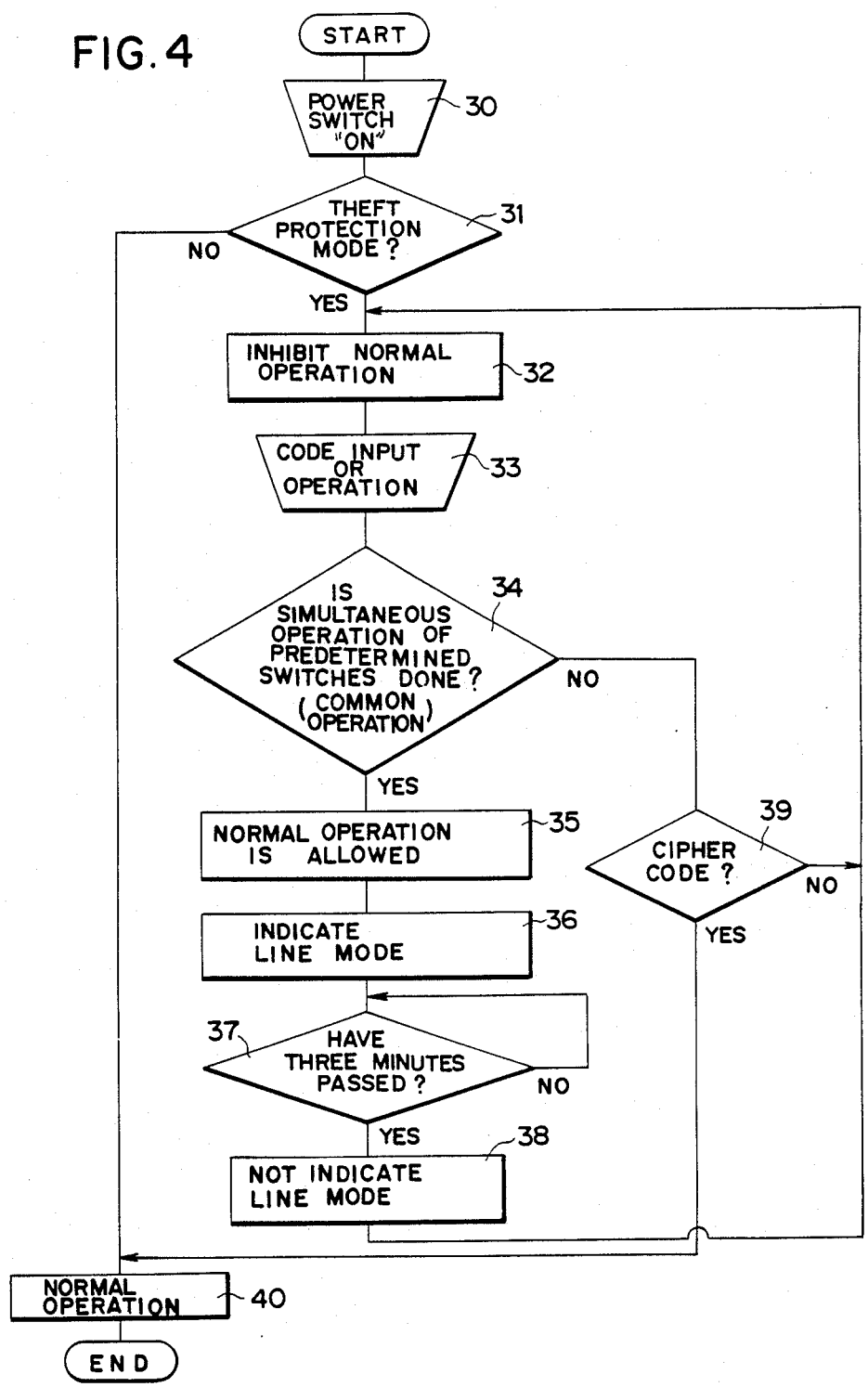
Figure 5:
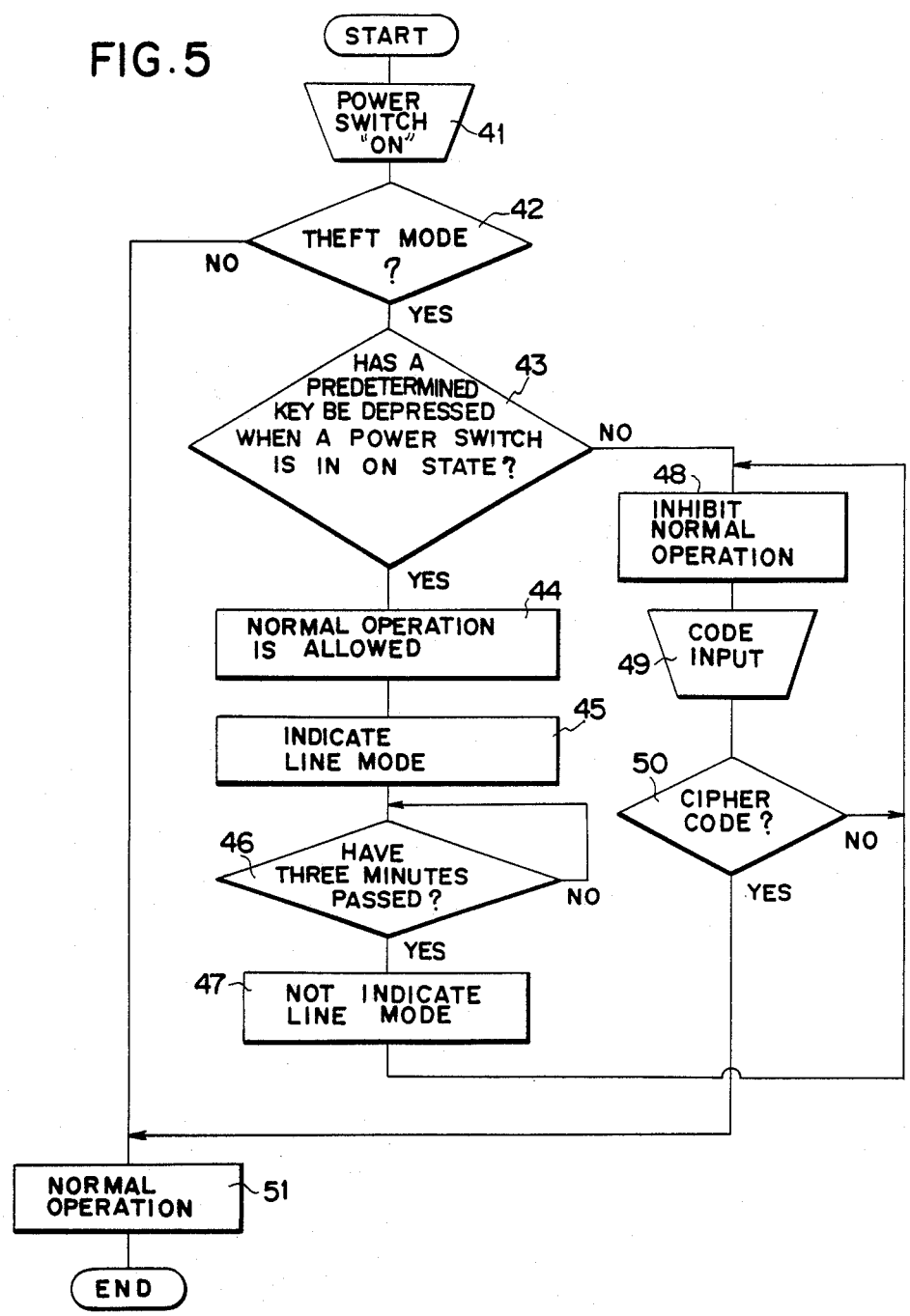

When any operation is performed in the theft mode, the CPU of the computer 18 compares its content with the storage in the RAM. When it coincides with the secret code, the instrument is set in the normal operation mode, and when it coincides with the content of the common operation, the instrument is set in the line mode. When it does not coincide with any of them, the theft mode is maintained. In the line mode, the normal operation mode is established for a limited time, monitoring the count of the timer, and it is subsequently replaced by the theft mode. FIGS. 4 and 5 are flow charts showing different processes of this operation. In FIG. 4, the "common operation" for transition to the line mode includes operation of a predetermined switch other than the power source switch, e.g. simultaneous operation of the band switching key 12 and the loudness key 13. Switches depressed simultaneously may be more than two. Although the flow chart does not show, "pushing predetermined keys in a predetermined order" may be an effective configuration of "common operation". Further, the line mode may be established by a single switching operation such as pushing the band switching key 12 alone, for example. This certainly increases a possibility that a third party occasionally finds how to effect the "common operation". However, since the system restores the theft mode soon after, it never invites any practical problem.

FIG. 5 shows an arrangement in which the "common operation" is simultaneous operation of the power source switch and a predetermined switch. Because of the nature of the power source switch, it is judged whether the predetermined switch is already pushed when the power source switch is turned on.

FIG. 6 shows an arrangement in which the "common operation" is a number as the secret code. In both cases, the secret code is shown as being a number of four digits selected from 1 to 6 and entered through the preset channel keys 11. The secret code may be replaced by simultaneous operation of predetermined keys. However, since unique contents must be set for individual mass-produced instruments, several-digit numbers will be most practical.

The flow chart of FIG. 4 is briefly explained below in sequence. When the power switch is turned on (30), it is judged whether the system is in the theft mode, i.e., whether the backup power is once cut off (31). If the system is not in the theft mode, it is directly activated for its normal operation (40). If the system is in the theft mode, the normal operation of the system is prohibited by muting or other method (32). In this case, the theft mode may be displayed. When some operation is performed at 33, it is judged whether the operation is the common operation commonly determined for all instruments. In FIG. 4, it is judged whether the operation is simultaneous operation of predetermined switches (34a) whereas, in FIG. 5, it is judged whether it is the common code of four digits (34b). In case of "Yes", the normal operation is allowed (35), and the line mode is established and displayed (36). When a predetermined time, e.g. three minutes, has passed thereafter (37), the display of the line mode disappears (38), and the theft mode is restored (32). If it is determined at 34a/34b that the operation at 33 is not the common operation, it is judged whether the operation coincides with the secret code (39). If it coincides with the secret code, the normal operation is performed (40), but if not, the theft mode is maintained (32).

FIG. 6 has the substantially same flow as FIG. 4 except that it is judged at 56 whether the code entered at 55 is the common code or not.

In FIG. 5, when the power switch is turned on (41), it is judged whether the system is in the theft mode or not (42). If it takes the theft mode, it is judged whether the predetermined switch had been pushed when the power switch was turned on, i.e., whether the "common operation" was effected or not (43). In case of "Yes", the normal operation is allowed (44), and the line mode is established (45 to 47). When three minutes have passed thereafter, the normal operation is prohibited (48), and the theft mode is established. In case of "No" at 43, i.e., when the "common operation" was not effected, the theft mode is maintained, and the normal operation is prohibited until the secret code is entered (49). When it is recognized at 50 that a code entered at 49 is the secret code, the normal operative mode (51) is established. If it is not the secret code, the flow returns back to 48 to maintain the theft mode.

As described above, when the invention is used in a car electronic device, an operator merely knowing the common operation can activate the instrument for its normal operation for the purpose of a test or an inspection. Therefore, it greatly improves his working speed, and the secret code is maintained unknown. Further, since the theft mode is restored a predetermined time later, a bad use of the line mode is prevented.

What is claimed is:

1. A car electronic device having an input arrangement and having an antitheft mechanism which can take a normal operative mode continuously permitting normal operation of said electronic device, a theft mode inhibiting normal operation of said electronic device, and a line mode permitting normal operation of said electronic device for a limited time and then subsequently effecting a change to said theft mode, said theft mode being replaced by said normal operative mode when a secret code unique to said device is inputted through said input arrangement and being replaced by said line mode when a common operation is effected.

2. A car electronic device according to claim 1 wherein said input arrangement includes a plurality of switches, and wherein said common operation is simultaneous operation of multiple said switches of said input arrangement.

3. A car electronic device according to claim 1 wherein said common operation is inputting through said input arrangement a common code consisting of digits.

4. An electronic device, comprising: first means for operatively coupling said electronic device to a vehicle; a manually operable input arrangement; second means for carrying out a predetermined function; and an antitheft apparatus operable in normal, line and theft modes; wherein said antitheft apparatus includes third means for permitting said second means to carry out said predetermined function in said normal and line modes and for preventing said second means from carrying out said predetermined function in said theft mode, said antitheft apparatus including means responsive to disconnection of said electronic device from a vehicle for effecting a change to said theft mode, responsive to entry of an input unique to said device through said input arrangement during said theft mode for effecting a change to said normal mode, responsive to entry of a universal input through said input arrangement during said theft mode for effecting a change to said line mode for a predetermined time interval, and responsive to the expiration of said predetermined time interval in said line mode for effecting a change to said theft mode.

5. A device of claim 4, wherein said first means includes means for supplying electric power to said electronic device from a vehicle to which said electronic device is operatively coupled, and wherein said means responsive to disconnection of said electronic device detects interruption of electric power from a vehicle.

6. A device according to claim 5, including means for providing electric power within said device following interruption of electric power from a vehicle to said electronic device.

7. A device of claim 4, wherein said input arrangement includes a plurality of switches, and wherein said universal input involves simultaneous operation of at least two of said switches.

8. A device of claim 4, wherein said input arrangement includes a plurality of switches, and wherein said universal input involves operation of at least two of said switches in a predetermined sequence.

9. A device of claim 4, wherein said input arrangement includes a plurality of switches, and wherein said input unique to said device involves operation of at least two of said switches in a predetermined sequence.

10. A device of claim 4, including mode indication means for providing an operator perceptible mode indication when said device is in one of said theft mode and said line mode.

* * * * *